(12) United States Patent
Ha et al.

(10) Patent No.: US 7,947,989 B2
(45) Date of Patent: May 24, 2011

(54) ROD TYPE LIGHT EMITTING DEVICE

(75) Inventors: Jun seok Ha, Seoul (KR); Jong wook Kim, Seongnam-si (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 1403 days.

(21) Appl. No.: 11/436,771

(22) Filed: May 19, 2006

(65) Prior Publication Data

US 2007/0041214 A1 Feb. 22, 2007

(30) Foreign Application Priority Data

May 24, 2005 (KR) .................. 10-2005-0043577
May 26, 2005 (KR) .................. 10-2005-0044373

(51) Int. Cl.
*H01L 33/00* (2010.01)

(52) U.S. Cl. .................. 257/79; 257/E33.005; 438/34; 977/950

(58) Field of Classification Search .................. 257/79, 257/101, E25.019, E33.025, E33.005; 438/34, 438/39, 46; 977/816, 950
See application file for complete search history.

(56) References Cited

U.S. PATENT DOCUMENTS

| 4,920,793 | A  | * | 5/1990  | Djorup .................. 73/170.12 |
| 5,981,977 | A  | * | 11/1999 | Furukawa et al. .............. 257/94 |
| 6,429,032 | B1 | * | 8/2002  | Okuyama et al. .............. 438/22 |
| 6,518,494 | B1 | * | 2/2003  | Shibuya et al. .............. 136/261 |
| 6,818,465 | B2 | * | 11/2004 | Biwa et al. .................. 438/22 |
| 7,102,173 | B2 | * | 9/2006  | Yi et al. .................. 257/79 |
| 7,129,514 | B2 | * | 10/2006 | Okuyama et al. .............. 257/13 |
| 7,459,728 | B2 | * | 12/2008 | Oohata .................. 257/98 |
| 7,521,274 | B2 | * | 4/2009  | Hersee et al. .............. 438/41 |
| 7,635,600 | B2 | * | 12/2009 | Zhang et al. .................. 438/7 |
| 7,679,077 | B2 | * | 3/2010  | Yao et al. .................. 257/15 |
| 2001/0026950 | A1 | * | 10/2001 | Sunakawa et al. .............. 438/47 |
| 2002/0145148 | A1 | * | 10/2002 | Okuyama et al. .............. 257/88 |
| 2004/0109666 | A1 | * | 6/2004  | Kim, II .................. 385/147 |
| 2005/0227391 | A1 | * | 10/2005 | Jin et al. .................. 438/22 |
| 2005/0253138 | A1 | * | 11/2005 | Choi et al. .................. 257/40 |
| 2006/0207647 | A1 | * | 9/2006  | Tsakalakos et al. .......... 136/256 |
| 2008/0157057 | A1 | * | 7/2008  | Kim .................. 257/13 |
| 2008/0210956 | A1 | * | 9/2008  | Kim .................. 257/88 |
| 2009/0146142 | A1 | * | 6/2009  | Kim et al. .................. 257/43 |
| 2010/0078625 | A1 | * | 4/2010  | Hsu .................. 257/13 |
| 2010/0148149 | A1 | * | 6/2010  | Pedersen et al. .............. 257/13 |
| 2010/0193813 | A1 | * | 8/2010  | Kao et al. .................. 257/98 |

FOREIGN PATENT DOCUMENTS

JP 2003-282942 10/2003

* cited by examiner

*Primary Examiner* — Thao X Le
*Assistant Examiner* — William F Kraig
(74) *Attorney, Agent, or Firm* — McKenna Long & Aldridge LLP

(57) ABSTRACT

A rod type light emitting device and a method for fabricating the same are disclosed, wherein rods are formed of a material capable of emitting light on a first polarity layer, and a second polarity layer is formed to wrap around each of the rods, such that a light emitting area increases and the amount of light emitted to the outside without being confined within a device also increases, thereby improving the light output of the device. Further, an active layer is formed of a nano rod structure to enhance light extraction efficiency.

9 Claims, 11 Drawing Sheets

ROD TYPE LIGHT EMITTING DEVICE

This application claims priority to Korean Application No. 10-2005-0043577 filed on May 24, 2005 and Korean Application No. 10-2005-0044373 filed May 26, 2005, which is incorporated by reference, as if fully set forth herein.

BACKGROUND

The present invention relates to a rod type light emitting device and a method for fabricating the same.

In general, a light emitting diode is a light source with a single wavelength, which has various applications such as light sources for cars, electronic display boards, lighting devices, and backlight units for display devices.

Light generated in a light emitting diode is mostly confined inside the diode due to total internal reflection with a critical angle at an interface between two media such as a semiconductor and air.

FIG. 1 is a conceptual diagram illustrating a light path between two media having different refraction indices. When light travels from a first medium having a refraction index of '$n_1$' to a second medium having a refraction index of '$n_2$', the light follows the Snell's law that is expressed by Equation 1. That is, light incident on the second medium from the first medium with an angle less than the critical angle passes through an interface in-between and light incident at an angle larger than the critical angle undergoes a total internal reflection.

$$n_1 * \sin \theta_1 = n_2 * \sin \theta_2 \qquad (1)$$

Here, $\theta_1$ is an incident angle and $\theta_2$ is a refraction angle.

FIG. 2 is a schematic sectional view showing a light path in a typical light emitting diode. In the structure of a light emitting diode in which an n-semiconductor layer (11), an active layer (12) and a p-semiconductor layer (1-3) are laminated in sequence on a substrate (10), light (a, b, c) traveling to the outside of the device at an angle less than a critical angle among light emitted from the active layer (12) passes through an interface.

However, light (d) traveling toward the outside of the device at an angle ($\theta_3$) larger than the critical angle is totally reflected and confined within the device.

Therefore, as the amount of light confined within the device increases, the light output of the light emitting diode decreases and the characteristics thereof are degraded.

There are various methods for improving light extraction efficiency in a light emitting diode.

First, there is a method for increasing a probability of vertical incidence of light in a light emitting diode chip by changing the shape of the chip. It is known that it is theoretically optimum for a light emitting diode chip to have a hemispherical shape. However, there are disadvantages in that it is difficult to fabricate a light emitting diode chip having the hemispherical shape and fabrication costs thereof increase.

Second, there is a method for encapsulating a light emitting diode with a hemispherical epoxy dome. However, it is difficult to fabricate such a light emitting diode.

Third, there is a technique for replacing a substrate capable of resorbing light emitted from a light emitting diode with a total-internal reflection substrate.

In addition, there is a method of fabricating a light emitting diode with a micro cavity or resonant cavity structure. In this method, very fine control and re-productivity are required for the thickness or the like of constitutional layers upon fabrication of the structure. In this case, efficient extraction of light from a semiconductor to air involves a difficulty in which an emission wavelength of a light emitting diode should precisely conform to a cavity mode.

Furthermore, if temperature or an operating current increases, there is a problem in that the emission wavelength of a light emitting diode is changed to cause a rapid reduction in light output.

On the other hand, in order to improve light extraction efficiency of a light emitting diode, in recent years, there have been proposed surface texturing techniques in which the surface of a light emitting diode chip for emitting light generated from the inside thereof to the outside is artificially roughened or formed with a regularly repeated pattern.

The surface texturing techniques are for improving light extraction efficiency in a light emitting diode chip. They can further improve the light extraction efficiency by being employed in combination with other existing techniques such as a chip shape modification technique, an epoxy encapsulation technique, and a substrate modification technique.

The surface texturing techniques currently employ a method for providing a texture on a surface by forming a pattern using a mask or the like and performing wet or dry etching.

In these techniques, each layer in the structure of a light emitting diode has a certain thickness and thus the height of a surface texture is restricted. In addition, etching thickness needs to be precisely controlled and re-produced during the etching process.

Furthermore, there is a problem in that a variety of processes such as formation of a pattern for etching are required.

SUMMARY

The present invention is conceived to solve the aforementioned problems in the prior art. It is an object of the present invention to provide a rod type light emitting device and a method for fabricating the same, wherein rods are formed on a first polarity layer, and a second polarity layer is formed to wrap around each of the rods, so that a light emitting area can be increased by causing light to be emitted through the entire surfaces of the rods and the light output of the device can be improved by increasing the amount of light emitted to the outside without being confined within the device.

It is another object of the invention to provide a rod type light emitting device and a method for fabricating the same, wherein nano rod structures including active layers is formed to increase a light emitting area of the device, thereby improving light extraction efficiency.

According to a first aspect of the present invention for achieving the objects, there is provided a rod type light emitting device, comprising: a first polarity layer; a plurality of light emitting rods formed on the first polarity layer such that they are spaced apart from one another; and a second polarity layer wrapping around each of the plurality of rods.

According to a second aspect of the present invention for achieving the objects, there is provided a rod type light emitting device, comprising: a support layer; an ohmic-contact and reflective electrode formed on the support layer; a plurality of nano rod structures which are formed on the ohmic-contact and reflective electrode and each of which sequentially comprises a compound semiconductor layer doped with a first polarity dopant, an active layer, and a compound semiconductor layer doped with a second polarity dopant; and an ohmic-contact and transmissive electrode formed on the nano rod structures.

According to a third aspect of the present invention for achieving the objects, there is provided a method for fabricating a rod type light emitting device, comprising: forming a flat, first polarity layer on a substrate; forming a plurality of light emitting rods spaced apart from one another on the first polarity layer; and forming a second polarity layer wrapping around each of the plurality of rods.

According to a fourth aspect of the present invention for achieving the objects, there is provided A method for fabricating a rod type light emitting device, comprising: forming a plurality of nano rods on a base substrate, the nano rods being made of a compound semiconductor doped with a first polarity dopant; forming a plurality of rod structures by sequentially forming an active layer and a compound semiconductor layer doped with a second polarity dopant on each of the plurality of nano rods; forming an ohmic-contact and reflective electrode on the rod structures; forming a support layer on the ohmic-contact and reflective electrode; removing the base substrate from the rod structures; and forming an ohmic-contact and transmissive electrode on bottoms of the rod structures, which are exposed by the removal of the base substrate.

DETAILED DESCRIPTION

Figure 1:
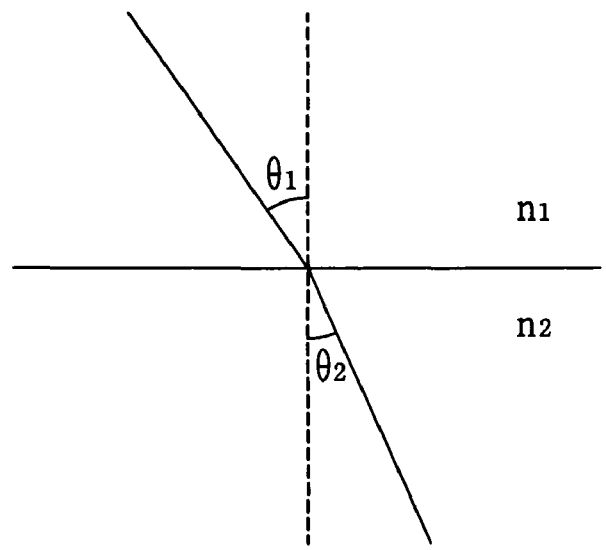
FIG. 1 is a conceptual diagram illustrating a light path between two media having different refraction indices.
Figure 2:
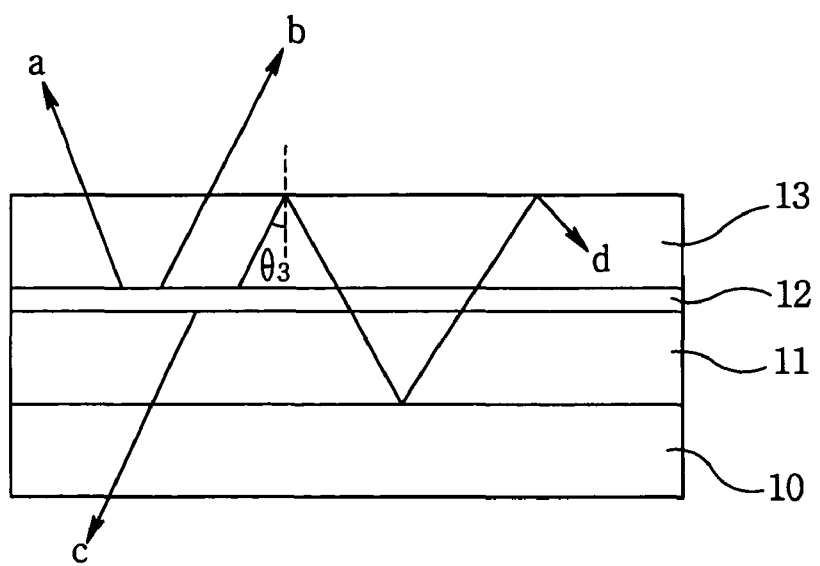
FIG. 2 is a schematic sectional view showing a light path in a typical light emitting diode.
Figure 3A:
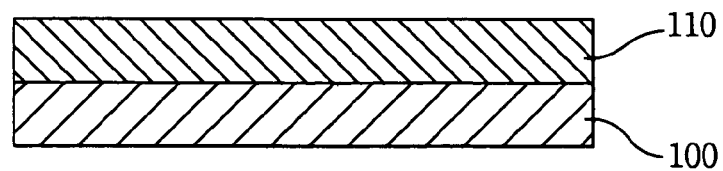
FIGS. 3a to 3c are sectional views illustrating processes of fabricating a light emitting device with rods according to a first embodiment of the present invention.
Figure 3B:
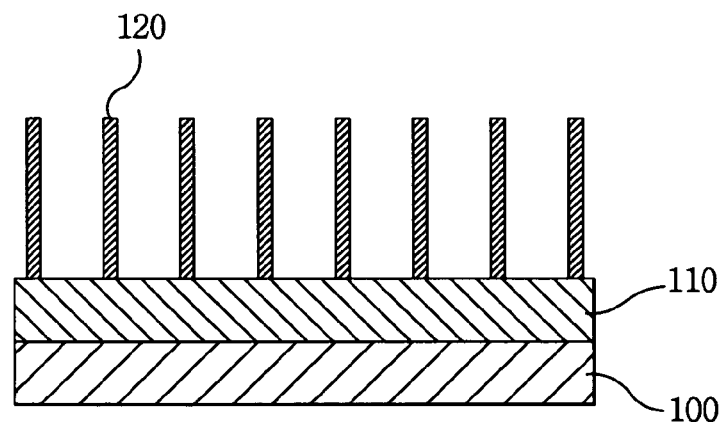
Figure 3C:
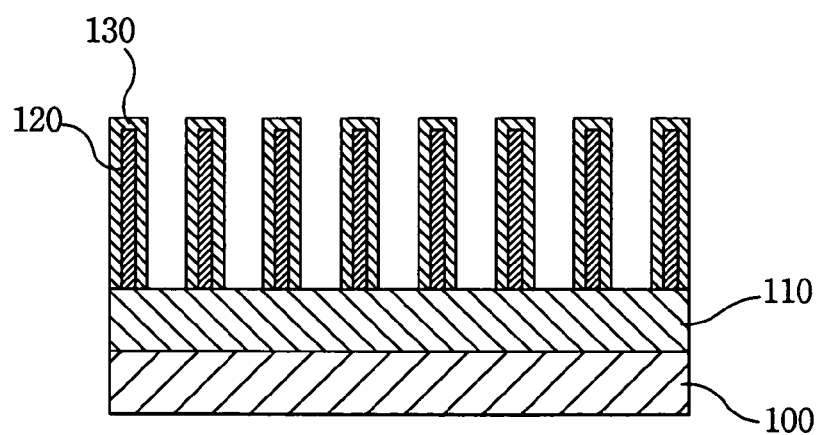

FIGS. 3a to 3c are sectional views illustrating processes of fabricating a light emitting device with rods according to a first embodiment of the present invention. First, a first polarity layer (110) is levelly formed on a substrate (100) (FIG. 3a).

Then, a plurality of light emitting rods (120) are formed on the first polarity layer (110) such that they are spaced apart from one another (FIG. 3b).

Thereafter, a second polarity layer (130) is formed to wrap around each of the plurality of rods (120) (FIG. 3c).

Here, the first polarity layer (110) and the second polarity layer (130) are defined as having opposite polarities.

For example, if the first polarity layer (110) is an n-type semiconductor layer, the second polarity layer (130) is a p-type semiconductor layer.

That is, if the first polarity layer (110) is an n-type, it is an electron-supplying layer. If the second polarity layer (130) is a p-type, it is a hole-supplying layer.

The polarities of the first and second polarity layers (110, 130) can be designed arbitrarily.

In addition, the plurality of rods (120) correspond to active layers capable of emitting light.

When the aforementioned processes are performed in such a manner, it is possible to fabricate a basic rod type light emitting device shown in FIG. 3c.

That is, the rod type light emitting device according to the first embodiment of the present invention comprises the first polarity layer (110), the plurality of light emitting rods (120) formed on the first polarity layer (110) such that they are spaced apart from one another, and the second polarity layer (130) wrapping around each of the plurality of rods (120).

Here, the substrate (100) is preferably provided below the first polarity layer (110).

In addition, it is preferred that the plurality of rods (120) be ultra-minute structures having a width on the order of nanos.

Figure 4:
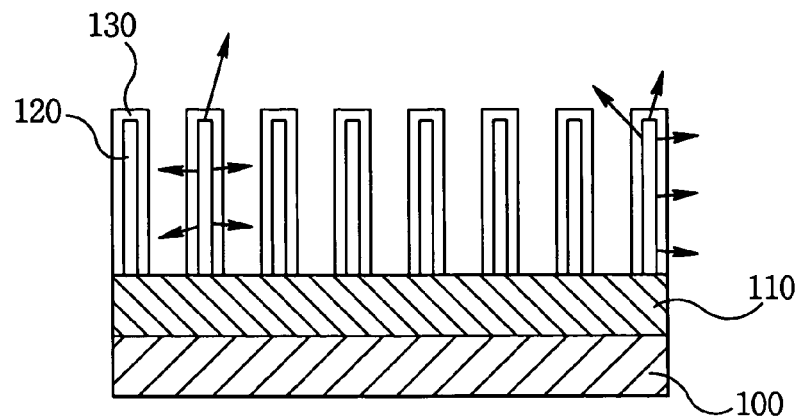
FIG. 4 is a sectional view showing a state where light is emitted from the rod type light emitting device according to the first embodiment of the present invention.

FIG. 4 is a sectional view showing a state where light is emitted from the rod type light emitting device according to the first embodiment of the present invention. Since the plurality of rods (120) are active layers capable of emitting light, each of the rods (120) emits light over an entire surface thereof. Thus, a light emitting area is increased to improve the light output of the device.

In addition, since the plurality of rods (120) spaced apart from one another emit light, the amount of light emitted to the outside without being confined within the device is increased. Thus, total internal reflection occurring in a conventional device is not a concern in the present invention.

Figure 5:
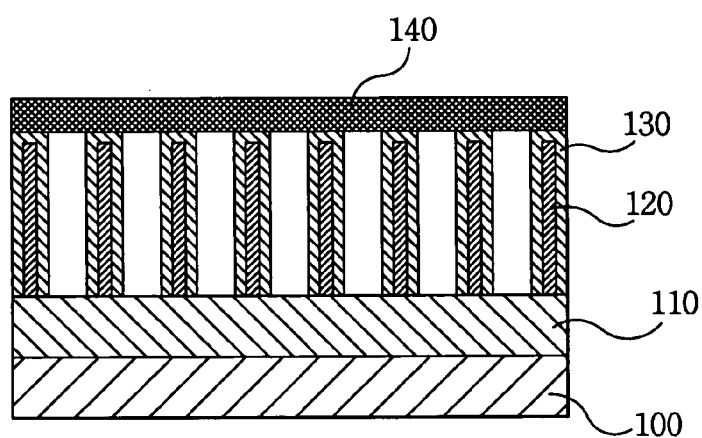
FIG. 5 is a sectional view showing a vertical structure of the rod type light emitting device according to the first embodiment of the present invention.

FIG. 5 is a sectional view showing a vertical structure of the rod type light emitting device according to the first embodiment of the present invention. If the substrate (100) illustrated in FIG. 3c is a conductive substrate, an electrode (140) is formed on the rods (120).

In this case, an electric current flows from the substrate (100) to the electrode (140), and thus, electrons and holes are injected into the rods (120).

Therefore, it is possible to implement a light emitting device with a vertical structure in which electrodes exist on and below the device.

Figure 6:
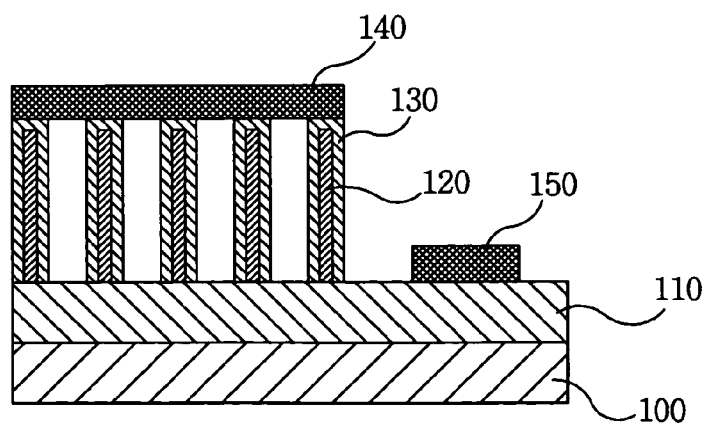
FIG. 6 is a sectional view showing a horizontal structure of the rod type light emitting device according to the first embodiment of the present invention.

FIG. 6 is a sectional view showing a horizontal structure of the rod type light emitting device according to the first embodiment of the present invention. If the substrate (100) in FIG. 3c is a non-conductive substrate, the plurality of rods (120) are formed only on a part of the first polarity layer (110).

Then, electrodes (140, 150) are formed on the rods (120) and a part of the first polarity layer where a rod is not formed, respectively.

Therefore, even in the rod type light emitting device with the horizontal structure, an electric current flows between the electrodes (140, 150) and thus electrons and holes are injected into the rods (120) that in turn emit light.

Thus, it is possible to implement a horizontal type light emitting device in which electrodes exist on the device.

Figure 7A:
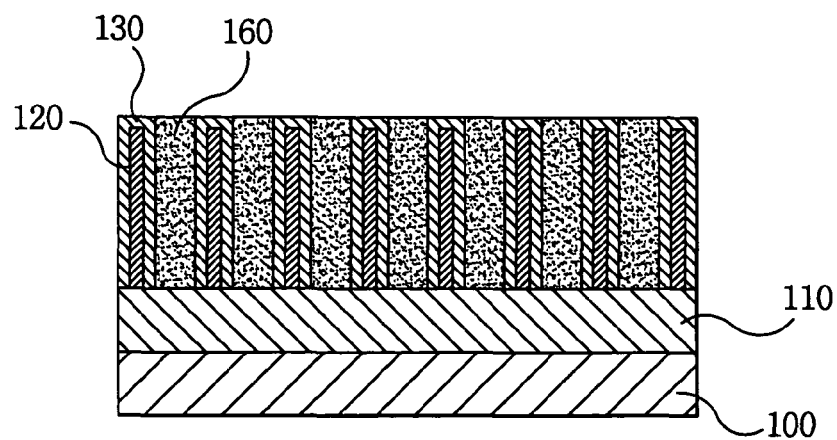
FIGS. 7a and 7b are sectional views showing a state where a conductive material is filled between the rods of the rod type light emitting device according to the first embodiment of the present invention.
Figure 7B:
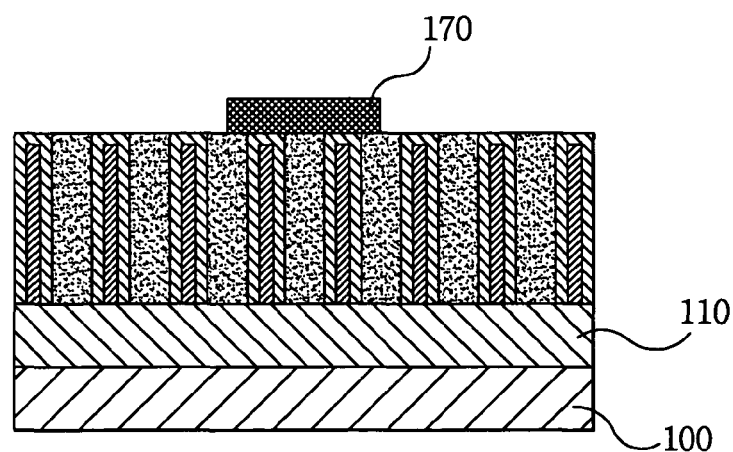

FIGS. 7a and 7b are sectional views showing a state where a conductive material is filled between the rods of the rod type light emitting device according to the first embodiment of the present invention. First, as shown in FIG. 7a, the conductive material (160) is filled between the second polarity layers (130) wrapping around the rods (120).

The conductive material (160) can facilitate the supply of an electric current to the rods (120).

At this time, the conductive material (160) is preferably a transparent conductive material in a sol-gel state. It is preferred that the transparent conductive material be one of ITO, IZO, ZnO and AZO.

Figure 8A:
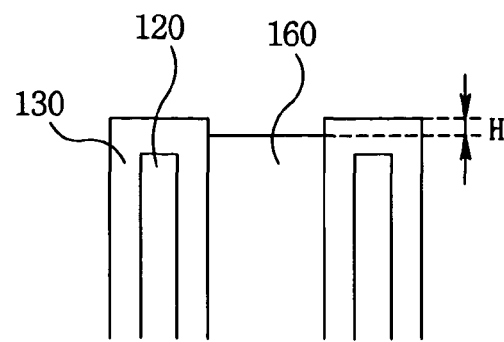
FIGS. 8a and 8b are views showing second polarity layers protruding beyond a conductive material film according to the first embodiment of the present invention and illustrating a light extraction path.
Figure 8B:
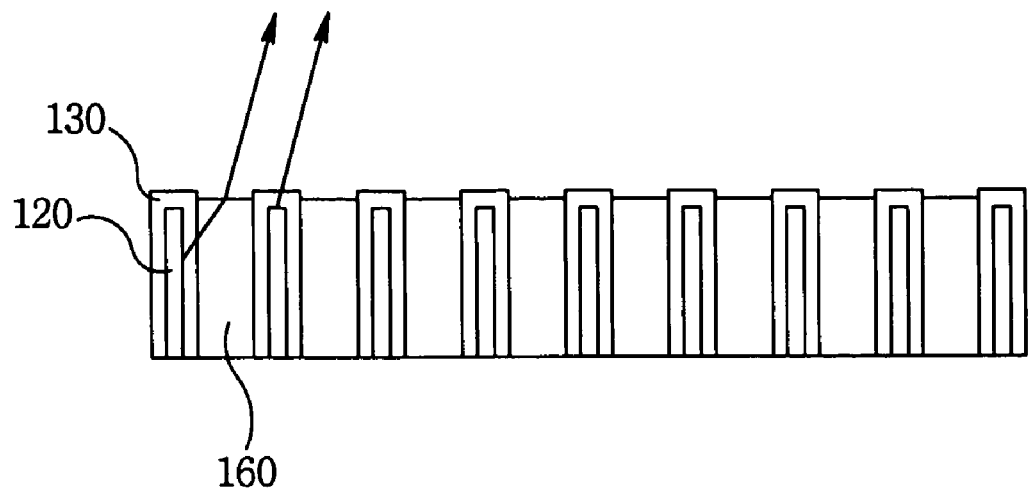

FIGS. 8a and 8b are views showing second polarity layers protruding beyond a conductive material film according to the first embodiment of the present invention and illustrating a light extraction path. First, as shown in FIG. 8a, the conductive material (160) is filled between the second polarity layers (130) wrapping around the rods (120) in such a manner that the second polarity layers (130) partially protrude beyond the conductive material (160).

If the second polarity layers (130) wrapping the rods (120) partially protrude (by a height of 'H') beyond the conductive material (160), convex and concave portions are formed on the rods (120) as shown in FIG. 8b. Thus, total internal reflection of light emitted from the rods (120) can be further reduced to increase the emission amount of light.

Figure 9:
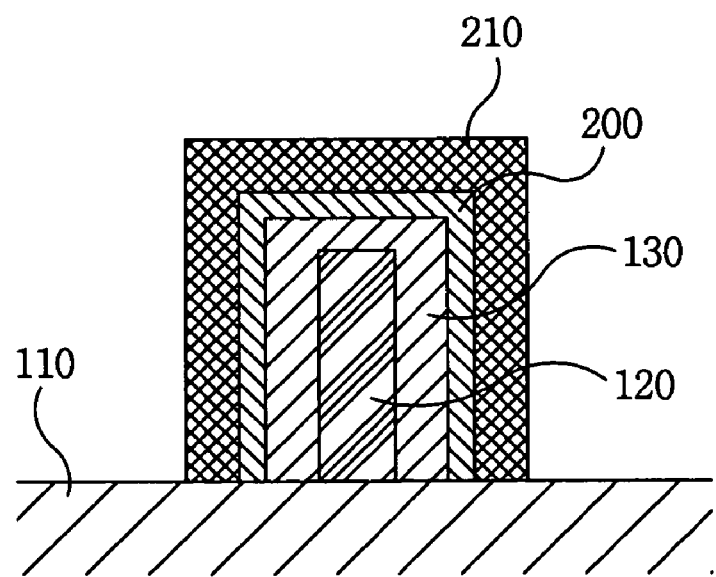
FIG. 9 is a sectional view showing another structure of the rod type light emitting device according to the first embodiment of the present invention.

FIG. 9 is a sectional view showing another structure of the rod type light emitting device according to the first embodiment of the present invention. As described above, the plurality of rods (120) are formed on the first polarity layer (110).

Then, each of the rods (120) is wrapped sequentially by a second polarity layer (130), a current transport enhanced layer (CTFL) (200) and a transparent conductive oxide film (210), thereby forming the rod type emitting device according to the first embodiment of the present invention.

The current transport enhanced layer (200) contains the material of the second polarity layer (130) and thus improves carrier mobility to facilitate the flow of an electric current.

In this way, if the entire area of the rod is sequentially brought into contact with the second polarity layer (130), the current transport enhanced layer (200) and the transparent conductive oxide film (210), contact resistance is significantly reduced and there is no need for a metallic electrode, resulting in superior light emitting efficiency.

Here, if the first polarity layer (110) is an n-GaN layer and the second polarity layer (130) is a p-GaN layer, the current transport enhanced layer (200) is formed of a material containing GaN.

In addition, the current transport enhanced layer (200) is defined as a layer formed of a material of which a work function is smaller than that of the second polarity layer (130) and larger than that of the transparent conductive oxide film (150).

This case will be explained with reference to FIGS. 10a and 10b. When the current transport enhanced layer (CTFL) and the transparent conductive oxide film are sequentially wrapped on the P-GaN layer, an energy band diagram at interfaces is shown in FIG. 10a.

Figure 10A:
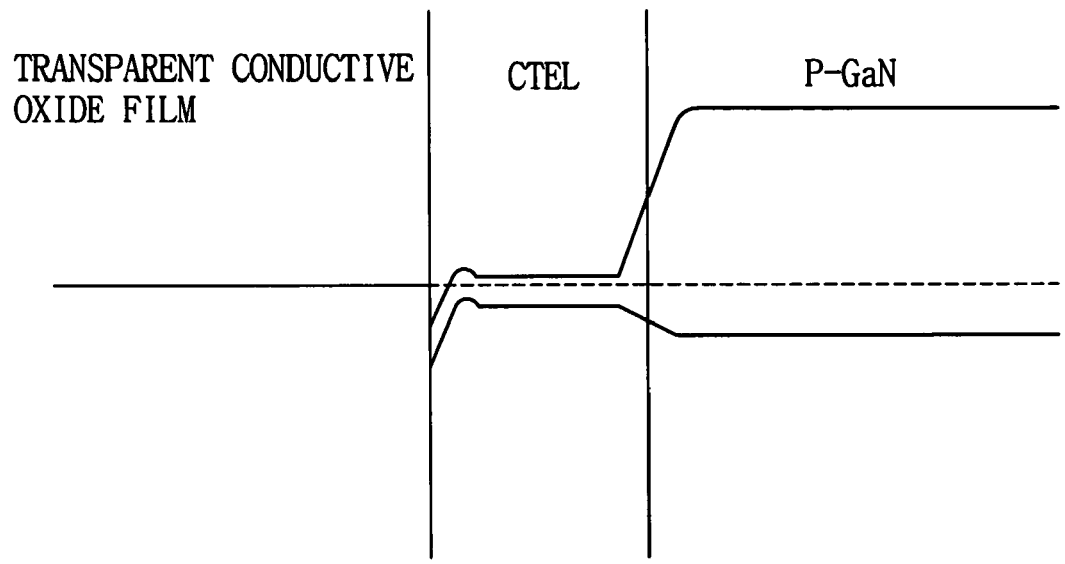
FIGS. 10a and 10b are diagrams showing an energy band of a transparent conductive oxide film, a current transport enhanced layer and a P-GaN before and after heat treatment in accordance with the first embodiment of the present invention.

As shown in FIG. 10a, the deposited transparent conductive oxide film is not in ohmic contact with the current transport enhanced layer.

Figure 10B:
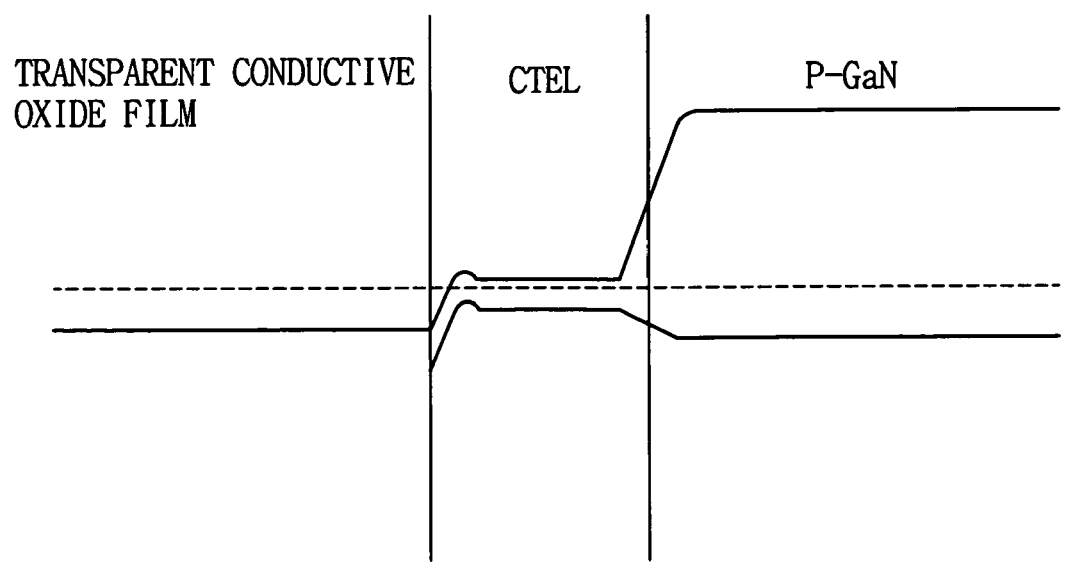

However, if the transparent conductive oxide film is deposited on the current transport enhanced layer and heat treatment is then carried out to increase the work function of the transparent conductive oxide film to 4.7-5.3 eV, the Schottky barrier is lowered to establish ohmic contact, as shown in FIG. 10b.

Therefore, the current transport enhanced layer enables holes injected from the transparent conductive oxide film to smoothly move into the P-GaN layer, so that carrier mobility can be improved to facilitate the flow of an electric current.

Figure 11A:
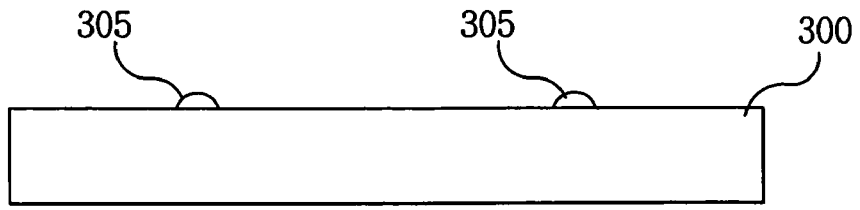
FIGS. 11a and 11b are schematic sectional views illustrating the concept of growth of nano-rods on a base substrate according to the present invention.
Figure 11B:
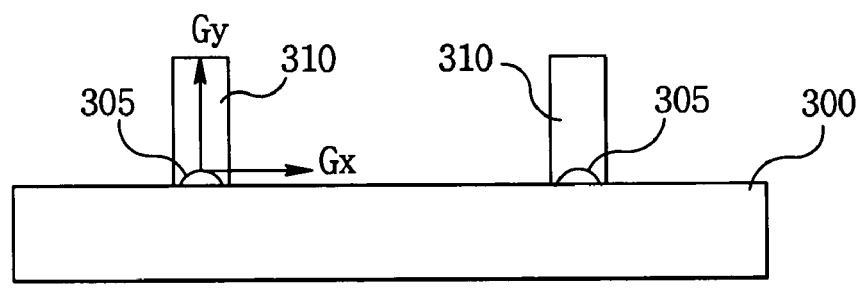

Meanwhile, in the rod type light emitting device, the rod may be formed through an etching process, or may be formed to have a size on the order of nanos using seeds shown in FIGS. 11a and 11b.

The rods may be formed by means of various other methods.

FIGS. 11a and 11b are schematic sectional views illustrating the concept of growth of nano-rods on a base substrate according to the present invention. The nano rod can be grown at a temperature of 200~900° C. First, as shown in FIG. 11a, if a compound semiconductor is grown on a base substrate, which is not a metallic substrate, at a grown temperature of 500° C. (within the temperature range of 200~900° C.), a plurality of seeds (305) are formed in a dot pattern on the original base substrate (300).

Thereafter, if a vertical growth component (Gy) is considerably dominant rather than a lateral growth component (Gx) in each of the seeds (305), the volume of the vertical growth becomes larger than that of the horizontal growth. Eventually, a plurality of nano rods (310) are formed to be spaced apart from one another.

Here, the growth temperature of 500° C. is a temperature relatively lower than the growth temperature of a compound semiconductor such as GaN.

Figure 12A:
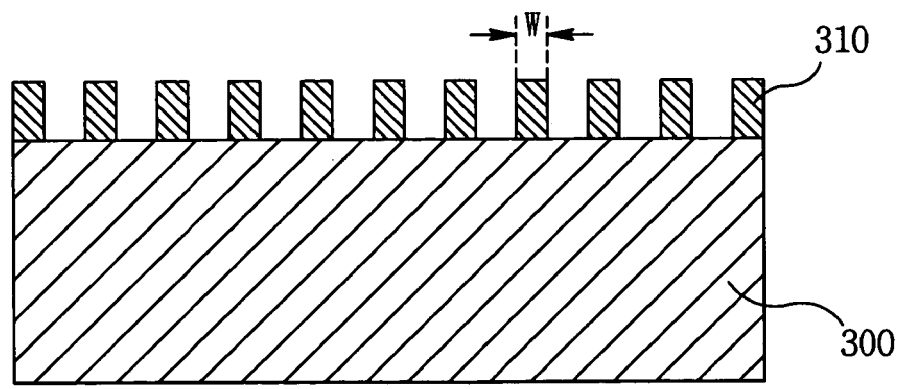
FIGS. 12a to 12e are sectional views illustrating processes for fabricating a rod type light emitting device according to a second embodiment of the present invention.

FIGS. 12a to 12e are sectional views illustrating processes for fabricating a rod type light emitting device according to a second embodiment of the present invention. First, a plurality of nano rods (310) formed of a compound semiconductor doped with a first polarity dopant are formed on a base substrate (300) (FIG. 12a).

Here, the base substrate (300) is not a metallic substrate but comprises a substrate made of an oxide-based material such as $Al_2O_3$ and $Ga_2O_3$, or a semiconductor material such as Si, SiC and GaAs.

In addition, the nano rods (310) are defined as nano rods and preferably each rod have a width (W) of 1~1,000 nm.

Furthermore, it is preferred that each of the nano rods (310) be a single-layered nano rod formed of any one selected from $Al_xGa_{1-x}N(0 \leq x \leq 1)$, $In_yGa_{1-y}N(0 \leq y \leq 1)$, $Zn_zMg_{1-z}O$ $(0 \leq z \leq 1)$ and $Zn_uCd_{1-u}O(0 \leq u \leq 1)$, or a multi-layered rod formed of a lamination of these materials.

The nano rods (310) are grown at a temperature range of 200~900° C. using crystal growth equipment such as MOVPE, HVPE and MBE.

Therefore, if a compound semiconductor doped with a first polarity dopant is grown on the base substrate (300), a plurality of nano rods (310) can be formed to be posts each perpendicular to the surface of the base substrate (300).

For reference, the light emitting device according to the second embodiment of the present invention employs a compound semiconductor doped with a first polarity dopant as a material for more specifically implementing the first polarity layer in the light emitting device of the first embodiment.

Figure 12B:
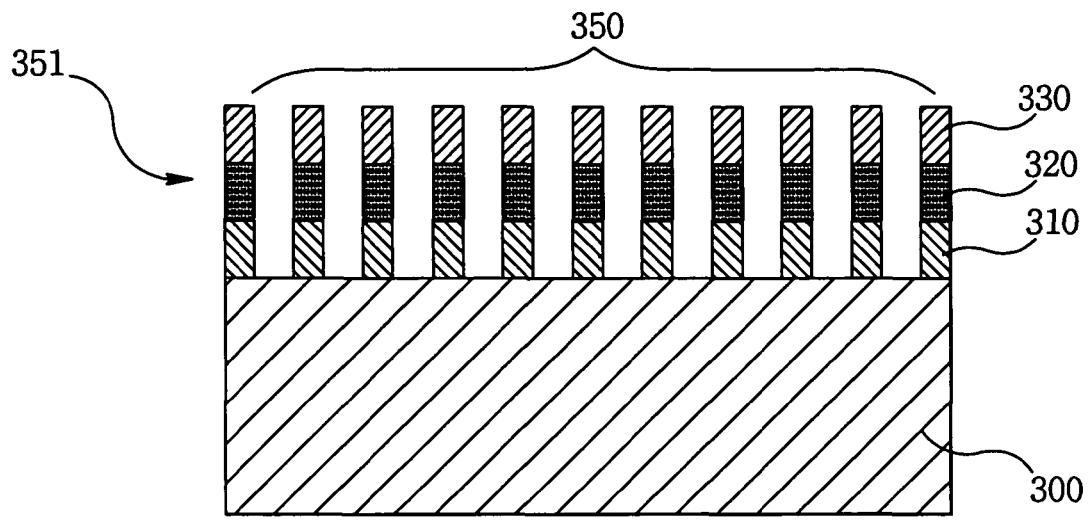

Thereafter, an active layer (320) and a compound semiconductor layer (330) doped with a second polarity dopant are sequentially formed on each of the rods (310) to form a light emitting structure (350) including a plurality of rod structures (351) spaced apart from one another (FIG. 12b).

Here, the active layer (320) and the compound semiconductor layer (330) doped with a second polarity dopant are formed sequentially on the nano rods (310) to form the rod structures (351) spaced apart from one another.

That is, each of the rod structures (351) grows independently from neighboring rod structures without interference.

In addition, the active layer (320) comprises a multiple quantum well structure.

In this way, the light emitting structure (350) composed of the plurality of rod structures is formed. Each of the rod structures comprises a compound semiconductor doped with a first polarity dopant, an active layer, and a compound semiconductor doped with a second polarity dopant.

The first polarity dopant is either an n-type dopant or a p-type dopant, and the second polarity dopant is a dopant having a polarity opposite to that of the first polarity dopant.

Therefore, since the first polarity dopant and the second polarity dopant have opposite polarities, it is also possible to form nano rods out of a compound semiconductor doped with a second polarity dopant on the base substrate (300).

For example, in a case where the compound semiconductor layer doped with a first polarity dopant is formed of N-GaN and the compound semiconductor layer doped with a second polarity dopant is formed of P-GaN, the active layer can define a multiple quantum well with a heterojunction by alternately laminating InGaN and GaN.

Figure 12C:
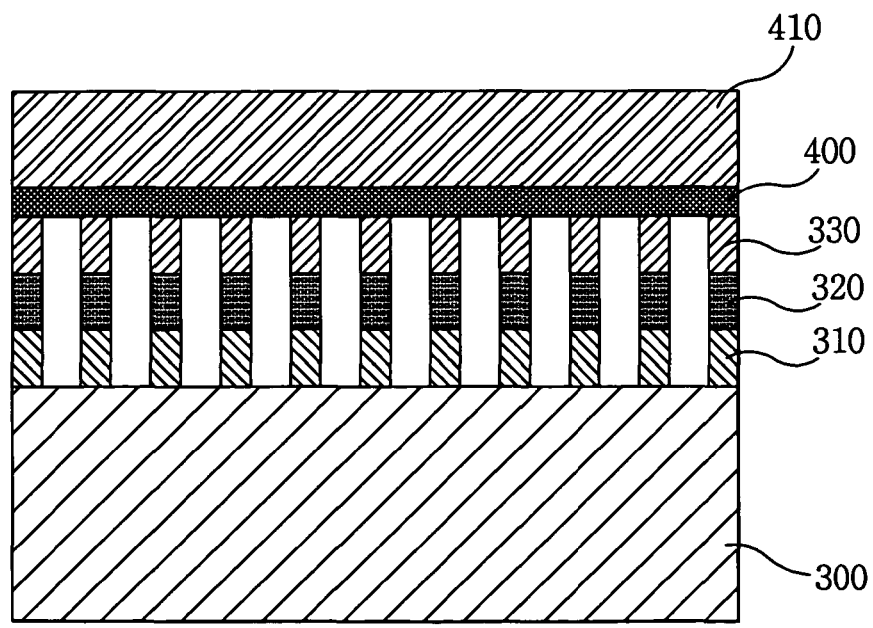

Consecutively, an ohmic-contact and reflective electrode (400) is formed on the rod structures (351), and a support layer (410) is formed on the ohmic-contact and reflective electrode (400) (FIG. 12c).

Here, the support layer (410) is preferably a layer formed on the ohmic-contact and reflective electrode (400) using any one of an electro-plating process, an electroless plating process, an evaporation process, a sputtering process and a screen printing process. Alternatively, the support layer (410) is preferably a pre-fabricated metallic substrate that is bonded to the ohmic-contact and reflective electrode (400).

Meanwhile, the ohmic contact and reflective electrode 400 may not be formed thereon with the support layer but may be formed with a support layer made of Si, SiC or the like.

Further, it is preferred that the thickness of the support layer (410) be in a range of 1~100 μm.

Figure 12D:
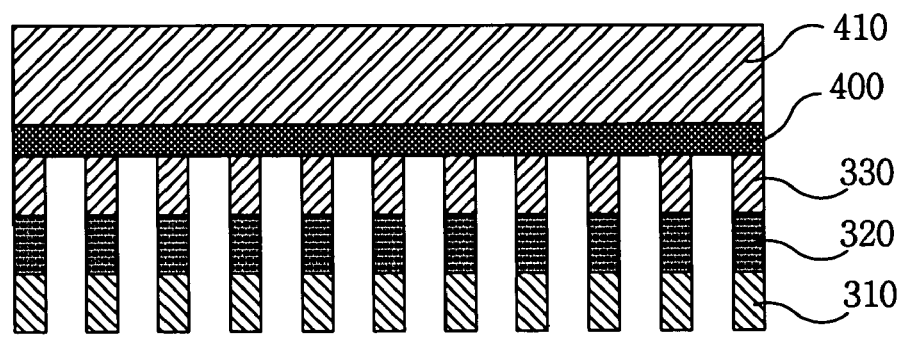

Subsequently, the base substrate (300) is removed from the rod structures (351) (FIG. 12d).

At this time, the base substrate (300) is removed using a laser process or a wet etching process.

Figure 12E:
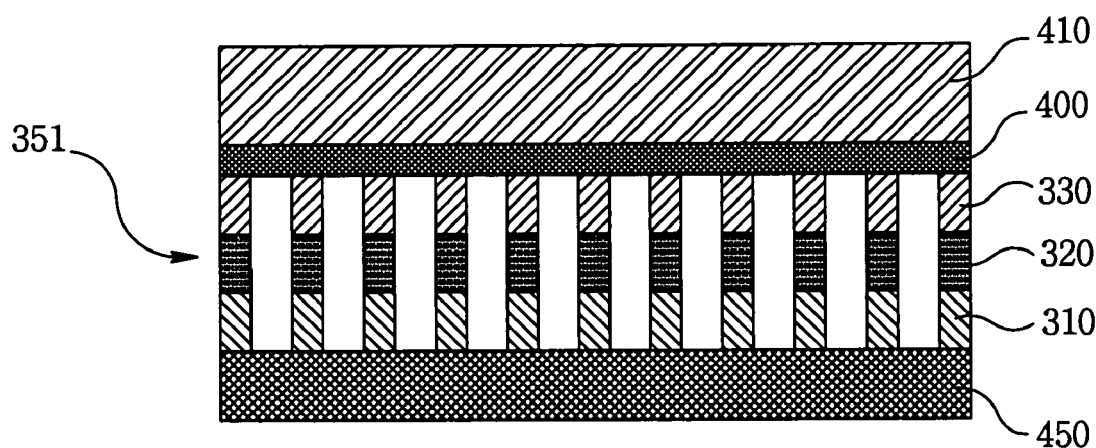

Finally, an ohmic-contact and transmissive electrode (450) is formed on bottoms of the rod structures (351) that have been exposed due to the removal of the base substrate (300) (FIG. 12e).

Here, the ohmic-contact and transmissive electrode (450) refers to, for example, a transparent electrode such as an ITO film.

That is, the ohmic-contact and reflective electrode (400) is defined as an electrode capable of being in ohmic contact and reflecting light. The ohmic-contact and transmissive electrode (450) is defined as an electrode capable of being in ohmic contact and transmitting light.

In this way, the rod type light emitting device of the second embodiment is completely fabricated.

That is, in an inverted state of the device of FIG. 12e, the rod type light emitting device comprises the support layer (410); the ohmic-contact and reflective electrode (400) formed on the support layer (410); the plurality of nano rod structures formed on the ohmic-contact and reflective electrode (400) so as to be spaced apart from one another; and the ohmic-contact and transmissive electrode (450) formed on the nano rod structures. Each of the nano rod structures comprises the compound semiconductor layer doped with the first polarity dopant, the active layer, and the compound semiconductor doped with the second polarity dopant, which are sequentially formed.

Figure 13:
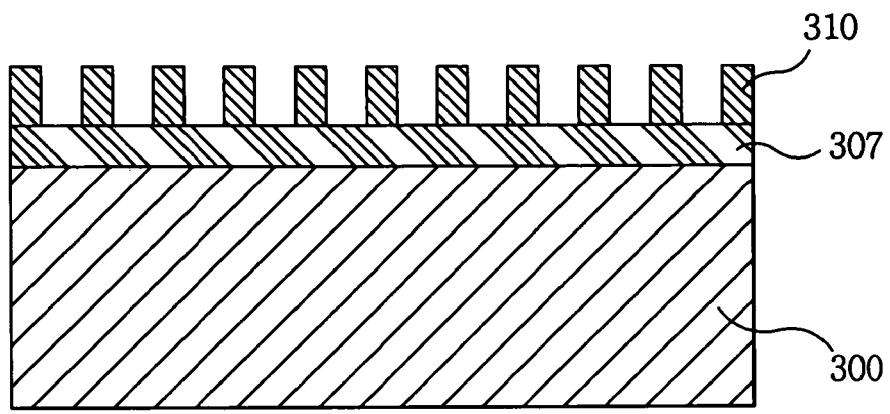
FIG. 13 is a schematic sectional view illustrating another method for fabricating the rod type light emitting device according to the second embodiment of the present invention.

FIG. 13 is a schematic sectional view illustrating another method for fabricating the rod type light emitting device according to the second embodiment of the present invention. A buffer layer (307) is formed on a base substrate (300). A plurality of nano rods (310) formed of a compound semiconductor doped with a first polarity dopant are formed on the buffer layer (307).

At this time, the plurality of the nano rods (310) are grown at a temperature lower than the growth temperature of the buffer layer (307).

Figure 14:
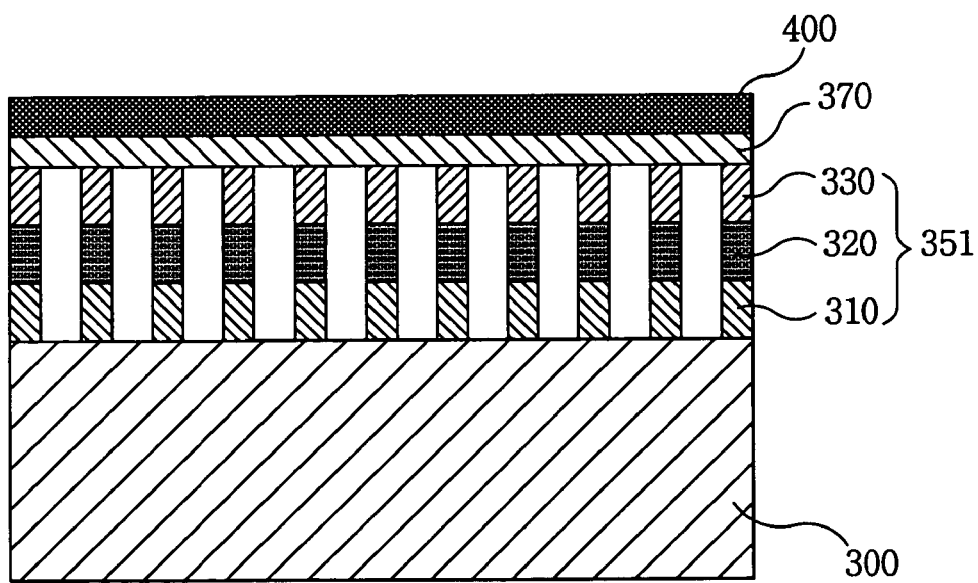
FIG. 14 is a schematic sectional view illustrating a further method for fabricating the rod type light emitting device according to the second embodiment of the present invention.

FIG. 14 is a schematic sectional view illustrating a further method for fabricating the rod type light emitting device according to the second embodiment of the present invention. A plurality of rod structures (351) are formed to be spaced apart from one another. Each of the rod structures (351) comprises a nano rod (310) made of a compound semiconductor doped with a first polarity dopant, an active layer (320), and a compound semiconductor layer (330) doped with a second polarity dopant, which are sequentially formed.

At this time, a planar compound semiconductor layer (370) doped with a second polarity dopant is grown on the compound semiconductor layers (330) doped with a second polarity dopant in the plurality of the rod structures (351). The planar compound semiconductor layer (370) is grown at a temperature higher than the growth temperature of the rod structures (351). Then, an ohmic-contact and reflective electrode (400) is formed on the planar compound semiconductor layer (370).

Then, as compared with a case of formation of the ohmic-contact and reflective electrode (400) on the rod structures (351), the electrode (400) can be more easily formed on the planar compound semiconductor layer (370) that is doped with a second polarity dopant.

That is, the rod structures (351) are in a state with spaces existing therebetween. Thus, the flat compound semiconductor layer (370) doped with a second polarity dopant allows for easier formation of the ohmic-contact and reflective electrode (400).

Figure 15:
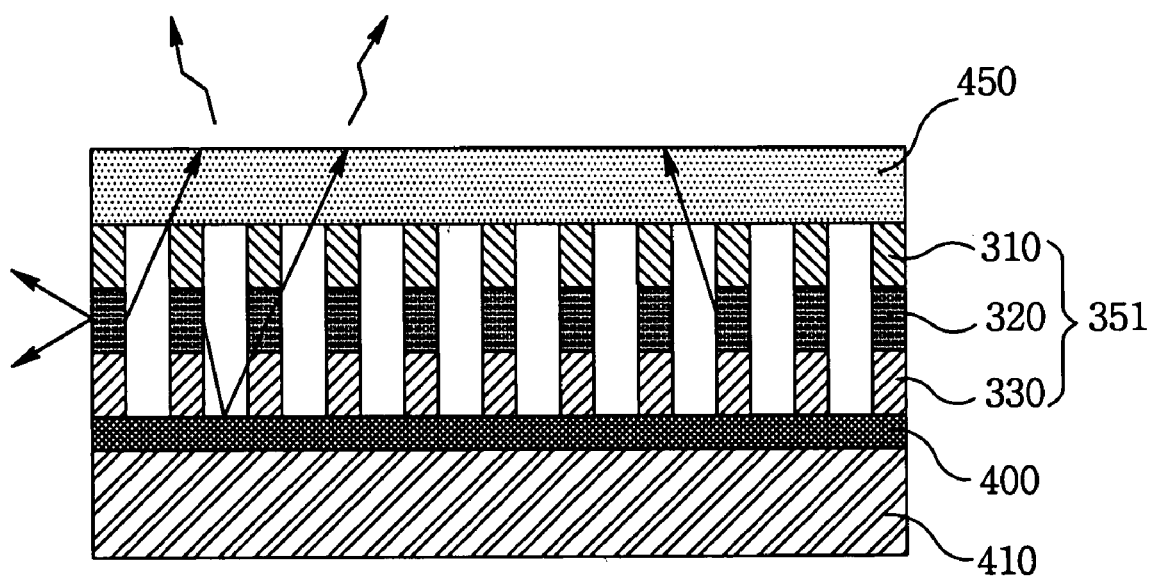
FIG. 15 is a sectional view illustrating a phenomenon in which light is emitted from the rod type light emitting device according to the second embodiment of the present invention.

FIG. 15 is a sectional view illustrating a phenomenon in which light is emitted from the rod type light emitting device according to the second embodiment of the present invention. Each of the rod structures (351) comprising the nano rod (310) formed of a compound semiconductor doped with a first polarity dopant, the active layer (320), and the compound semiconductor layer (330) doped with a second polarity dopant is a light emitting structure. Thus, light is emitted from the active layer (320) of each of the rod structures (351).

Therefore, since the plurality of rod structures emit light in the present invention, there is an advantage in that a light emitting area is increased as compared with a conventional device where light is emitted from the surface of the device.

In addition, since the rod structures are spaced apart from one another, there is an advantage in that light scattering can be reduced in the device and thermal characteristics can be improved.

Therefore, light extraction efficiency is improved.

Furthermore, when a GaN film is grown on a heterogeneous substrate, a defect called "threading dislocation" occurs with a density of $10^8 \sim 10^{10}$ cm$^2$ due to lattice mismatch. In case of a conventional light emitting diode, GaN is grown in the form of a thin film and thus a defect remains in the device. On the contrary, since growth is made in a nano rod at a low temperature in the rod type light emitting device of the second embodiment, stress and strain due to the lattice mismatch can be mitigated and propagation of the threading dislocation into ultra-minute nano rods can be reduced. Therefore, the light emitting structure is grown to have good crystalinity, thereby providing improved characteristics of the device.

According to the present invention described above, rods are formed of a material capable of emitting light on a first polarity layer and a second polarity layer is formed to wrap around each of the rods. Thus, there are advantages in that a light emitting area increases and the amount of light emitted to the outside without being confined within a device increases, thereby improving the light output of the device.

In addition, an active layer is formed of a nano rod structure to enhance light extraction efficiency.

Furthermore, since growth is made in a nano rod at a low temperature, stress and strain due to lattice mismatch can be mitigated and propagation of threading dislocation into the ultra-minute nano rod can be reduced. Therefore, the light emitting structure is grown to have good crystalinity, thereby providing improved characteristics of the device.

In addition, since the rod structures are spaced apart from one another, light scattering within the device can be reduced and thermal characteristics can be improved.

Although the present invention has been described in connection with the preferred embodiments, it is not limited thereto. It will be apparent to those skilled in the art that various modifications and changes can be made thereto without departing from the spirit and scope of the present invention defined by the appended claims.

What is claimed is:

1. A rod type light emitting device, comprising:
   a first polarity layer;
   a plurality of light emitting rods formed on the first polarity layer, the rods being spaced apart from one another;
   a second polarity layer wrapping around each of the plurality of rods;
   a current transport enhanced layer (CTEL) wrapping around the second polarity layer and containing the second polarity layer; and
   a transparent conductive oxide film wrapping around the current transport enhanced layer, wherein a work function of the current transport enhanced layer is smaller than that of the second polarity layer but larger than that of the transparent conductive oxide film.

2. The light emitting device as claimed in claim 1, wherein the first polarity layer has a polarity opposite to that of the second polarity layer.

3. The light emitting device as claimed in claim 1, wherein a substrate is further formed below the first polarity layer.

4. The light emitting device as claimed in claim 3, wherein the substrate is a conductive or non-conductive substrate.

5. The light emitting device as claimed in claim 1, wherein an electrode is formed on the rods.

6. The light emitting device as claimed in claims 3, wherein a conductive material is further filled between the second polarity layers wrapping around the rods.

7. The light emitting device as claimed in claim 6, wherein the conductive material comprises any one selected from ITO, IZO, ZnO and AZO.

8. The light emitting device as claimed in claim 6, wherein the second polarity layers wrapping around the rods partially protrude from the conductive material.

9. The light emitting device as claimed in claim 1, wherein the first polarity layer is an n-GaN layer, the second polarity layer is a p-GaN, and the current transport enhanced layer is a material containing GaN.

* * * * *